(12) United States Patent
Elian

(10) Patent No.: US 6,686,131 B2
(45) Date of Patent: Feb. 3, 2004

(54) METHOD OF PRODUCING BIOCOMPATIBLE STRUCTURES AND BIOCOMPATIBLE MICROCHIP

(75) Inventor: Klaus Elian, Erlangen (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/262,179

(22) Filed: Sep. 30, 2002

(65) Prior Publication Data

US 2003/0087203 A1 May 8, 2003

(30) Foreign Application Priority Data

Sep. 28, 2001 (DE) .......................................... 101 47 953

(51) Int. Cl.$^7$ ................................................. G03C 5/56
(52) U.S. Cl. ....................... 430/322; 430/326; 430/330; 430/270.1; 430/311
(58) Field of Search ................................. 430/322–326, 430/330, 270.1, 311

(56) References Cited

U.S. PATENT DOCUMENTS

| 4,491,628 A |   | 1/1985 | Ito et al. ..................... 430/176 |
| 5,234,793 A |   | 8/1993 | Sebald et al. ................ 430/323 |
| 6,106,993 A | * | 8/2000 | Watanabe et al. ........ 430/270.1 |

FOREIGN PATENT DOCUMENTS

| EP | 0 395 917 B1 | 11/1990 |
| EP | 0 955 562 A1 | 11/1999 |
| WO | 01/42860 A1 | 6/2001 |

* cited by examiner

*Primary Examiner*—Mark F. Huff
*Assistant Examiner*—Daborah Chacko-Davis
(74) *Attorney, Agent, or Firm*—Laurence A. Greenberg; Werner H. Stemer; Gregory L. Mayback

(57) ABSTRACT

A biocompatible structure is produced by first applying a chemically amplified photoresist to a substrate and structuring the photoresist. The photoresist comprises a polymer with anchor groups for linking a biocompatible compound. After the structuring of the resist, a solution of the biocompatible compound is applied so that the biocompatible compound is coordinated to the anchor groups of the polymer.

12 Claims, No Drawings

METHOD OF PRODUCING BIOCOMPATIBLE STRUCTURES AND BIOCOMPATIBLE MICROCHIP

BACKGROUND OF THE INVENTION

FIELD OF THE INVENTION

The invention relates to a process for the production of biocompatible structures and a biocompatible microchip. The description, as will become clear from the following text, may also be entitled: Utilization of CARL processes (chemical amplification of resist lines) for bioelectronics: substrate binding via an insulating layer Bioelectronics is a rapidly developing research area which combines chemistry, biochemistry and physics. Its aim is to effect communication between electronic apparatuses and living cells. The main feature of a bioelectronic component is the immobilization of a biomaterial on a conductive or semiconductive substrate and the conversion of biological functions associated with the biological material into electronic signals. Examples of microelectronic components by means of which biological functions can be influenced and controlled are cardiac pacemakers and inner ear auditory prostheses. The development of such bioelectronic components leads to increasingly complex systems wherein a large number of transmission channels for information transmission between electronic component and the cells to be influenced are required. Thus, for example, retina implants or prostheses for walking/standing are being developed. It is necessary, for that purpose, to develop implants which, with numerous contact points, can both stimulate nerve tissue in time sequence and detect a large number of nerve signals which can be resolved spatially and with respect to time. However, metallic electrodes as used in cardiac pacemakers are unsuitable here since these are recognized as foreign bodies and thus lead to rejection reactions. Attempts have therefore been made to produce the electrical contact between electronic component and biological tissue with the aid of polymers, such as, for example, silicones or polyurethane. For this purpose, the polymers must however be electrically conductive and additionally biocompatible, i.e. the materials must not give rise to any rejection reaction. In order to be able to contact nerve paths in a specific manner, a structuring of these materials or of the substrates used, for example mini-silicon wafers, i.e., silicon platelets having dimensions in the neighborhood of a few millimeters, is necessary. The dimensions of the structures, such as pyramids or holes, produced in or on the substrate are in a range from 10 $\mu$m to about 70 $\mu$m. The most critical element in bioelectronics is the interface between electronics and biological tissue. In order to produce suitable contact, the procedure adopted to date, for example, is first to etch about 25 $\mu$m deep pyramidal indentations into a silicon chip. The indentations are then first partly filled with conductive silicone and a second layer of nonconductive silicone is then applied. The polymers are then crosslinked and the structured flexible layer is then removed from the silicon chip. Finally, contact with the silicon protuberances formed on the surface of the flexible layer is produced by individual connecting lines.

A similar principle can be used to produce rectangular trenches having tiny dimensions from polyurethane, which trenches can act as microcells for the cultivation of nerve cells. In order to be able to connect individual neurons specifically to microsystems, supporting structures, such as, for example, trench-like microstructures, are provided on the surface of the substrate. Furthermore, adhesion promoters which facilitate the growth of cells on the surface of the substrate are applied to the surface. In such structures, seed cells grow into network-like structures, and biohybrid systems in the form of microchips covered with cell growth form. Materials which promote cell growth and support the adhesion of the cells are suitable as adhesion promoters at the interface.

In spite of the numerous activities in the area of bioelectronics, this area is still in an experimental stage, so that considerable progress is necessary, particularly in the region of the interface between electronic component and cells, in order to make this area accessible to medical use in practical applications.

SUMMARY OF THE INVENTION

It is accordingly an object of the invention-to provide a method of producing biocompatible structures and a biocompatible microchip, which overcomes the above-mentioned disadvantages of the heretofore-known devices and methods of this general type and which provides for a process for the production of biocompatible structures that is simple to carry out and that permits the production of a contact matrix having many contact points.

With the foregoing and other objects in view there is provided, in accordance with the invention, a method of producing biocompatible structures, which comprises:

providing a substrate;

depositing a chemically amplified photoresist containing a polymer with anchor groups for linking a biocompatible compound on the substrate;

structuring the photoresist for form a structured resist; and treating the structured resist with a biocompatible compound to coordinate the biocompatible compound to the anchor groups of the polymer.

The method according to the invention employs a technique as used in the lithographic structuring of semiconductor chips. This technique has been very widely developed and it can be used to produce structure dimensions down to the neighborhood of less than 100 nm. As already mentioned above, structures having dimensions in the region-of about 25 $\mu$m are required for bioelectronic applications. Structures having these dimensions can therefore be readily produced using the known photoresists and imaging techniques. The polymer used in the photoresist need only have anchor groups which permit subsequent linking of biocompatible substances. Subsequent modification of photoresists is already known from the structuring of semiconductors. In this process, the resist structures produced on a substrate are subsequently expanded by linking of expansion reagents in order to be able in this way to produce structures whose dimensions are below the resolution limit of the optical apparatuses used for exposure. Such resists and amplification processes are described, for example, in the commonly assigned publications European patent EP 395 917 B1 and U.S. Pat. No. 5,234,793 (CARL: chemical amplification of resist lines; CAR: chemically amplified resist).

In principle, all chemically amplified photoresists as well as all known structuring processes can be used for the production of the biocompatible structures. All that is necessary is that groups which permit the linking of a biocompatible compound are still present on the structured resist. Both positive and negative chemically amplified photoresists can be used. In the case of the positive chemically amplified resists, the exposed sections of the photoresist are removed by means of a developing solution in the development step, while the unexposed parts remain as lands on the substrate. This is achieved by virtue of the fact that the exposure liberates a catalyst, which changes the polymer of the photoresist in its chemical nature so that a substantial differentiation between exposed and unexposed parts is achieved. This can be achieved, for example, by eliminating groups on the polymer, with the result that the polarity of the polymer increases substantially so that it becomes soluble in aqueous developers. It is also possible to use negatively structurable resists, wherein the exposed parts remain on the substrate as lands while the unexposed parts are removed by means of an aqueous developer. The chemical differentiation between unexposed and exposed sections is generally carried out by a procedure wherein the exposure liberates a catalyst which, for example, produces crosslinking of the polymer of the photoresist, with the result that it becomes insoluble in aqueous developers. In the development step, the unexposed parts, which generally have compounds of high polarity, are then removed by means of an aqueous developer. It is also possible to use modified processes which are based on the above-mentioned positive and negative chemically amplified photoresist systems.

Such a process is described, for example, in U.S. Pat. No. 4,491,628. There, that layer of a positive photoresist which is applied to a substrate is first exposed, an acid being liberated from a photo acid generator. In the subsequent amplification step, acid-labile groups are eliminated from the polymer in the exposed parts by heating, so that the polymer is now present in a polar form. In contrast to the positive development process described above, development is now not effected with a polar aqueous developer but a nonpolar solvent is used for the development. Consequently, only the unexposed parts wherein the polymer has retained its original nonpolar form are detached from the substrate. Since the polar fractions of the resist wherein polar groups were produced by the exposure, for example carboxyl groups, are insoluble in nonpolar solvents, they remain as lands on the substrate.

A process as described, for example, in the commonly assigned PCT publication WO 01/42860 A1 can also be used for the production of a structured resist. There, the photoresist contains a photo base as well as a thermo acid. In the exposure of the photoresist, a base is liberated in the exposed parts. If the photoresist is then heated, an acid is liberated from the thermo acid generator. In the exposed parts, the acid is neutralized by the previously liberated base and is therefore no longer available as a catalyst. In the unexposed parts, the acid catalyzes the elimination of acid-labile groups from the polymer. In the unexposed parts, the polymer is therefore converted from its nonpolar form into a polar form. In the subsequent development step, the unexposed parts can therefore be selectively detached from the substrate by means of an aqueous alkaline developer, whereas the exposed parts remain as lands on the substrate.

In all these processes, it is essential that groups for binding the biocompatible compound are still available after the structuring of the photoresist.

However, a process as described in the above-mentioned European patent EP 0 395 917 B1 is preferably used for structuring the photoresist. The photoresist used is a positive photoresist to which, after exposure, amplification and development, the biocompatible compound is linked in a further step.

In this embodiment of the invention, the process comprises the following steps:

applying a chemically amplified photoresist to a substrate, the photoresist containing the following components:
a polymer which comprises acid-labile groups which, after their elimination, liberate a polar group with the result that the solubility of the polymer in aqueous alkaline developers is increased, and which furthermore has anchor groups for linking a biocompatible compound, it also being possible for the anchor groups to be present in protected form;

a photo acid generator; and a solvent;

drying the photoresist to obtain a photoresist film;

exposing the photoresist film in a section-by-section exposure;

heating the exposed photoresist film, the acid-labile groups being eliminated from the polymer in the exposed sections;

developing the exposed and heated photoresist film with an aqueous alkaline developer solution, the exposed sections of the photoresist film being detached from the substrate and a structured resist being obtained;

optionally liberating the anchor groups;

applying a solution of a biocompatible compound, the biocompatible compound being coordinated to the anchor groups of the polymer;

removing excess solution of the biocompatible compound.

Polymers used for the photoresist may be those polymers which, after development, still have a group to which the biocompatible compound can coordinate. The polymers must have adequate film formation properties in order to be able to produce a uniform film of the photoresist on the substrate. It is possible to use all polymers which have, in the polymer chain or as side groups, acid-labile groups which possess low alkali solubility and produce polar groups, for example acidic groups, on the polymer by catalytic action of acid and optionally simultaneous heat treatment (contrasting). Examples of suitable acid-labile groups are: tert-alkyl ester, tert-butoxycarbonyloxy, tetrahydrofuranyloxy, tetra-hydro-pyranyloxy, tert-butyl ether, lactone or acetal groups. tert-Butyl ester groups are particularly preferred.

The film-forming polymer can therefore be obtained by polymerization or copolymerization of corresponding monomers. Suitable monomers are, for example, acrylates, methacrylates, maleic monoesters and diesters, itaconic monoesters and diesters, norbornenecarboxylic esters or norbornenedicarboxylic monoesters and diesters. Appropriate repeating units of the polymer are shown below. Y is a radical which can be eliminated by acid, as contained, for example, in one of the abovementioned acid-labile groups and after whose elimination the polar group, for example, a carboxyl or hydroxyl group, is liberated, and $R^1$ is a non-acid-labile radical, for example an alkyl group having 1 to 10 carbon atoms. Furthermore, n is an integer between 1 and 10.

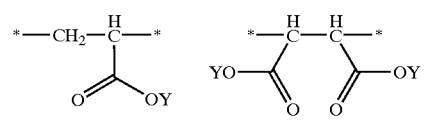

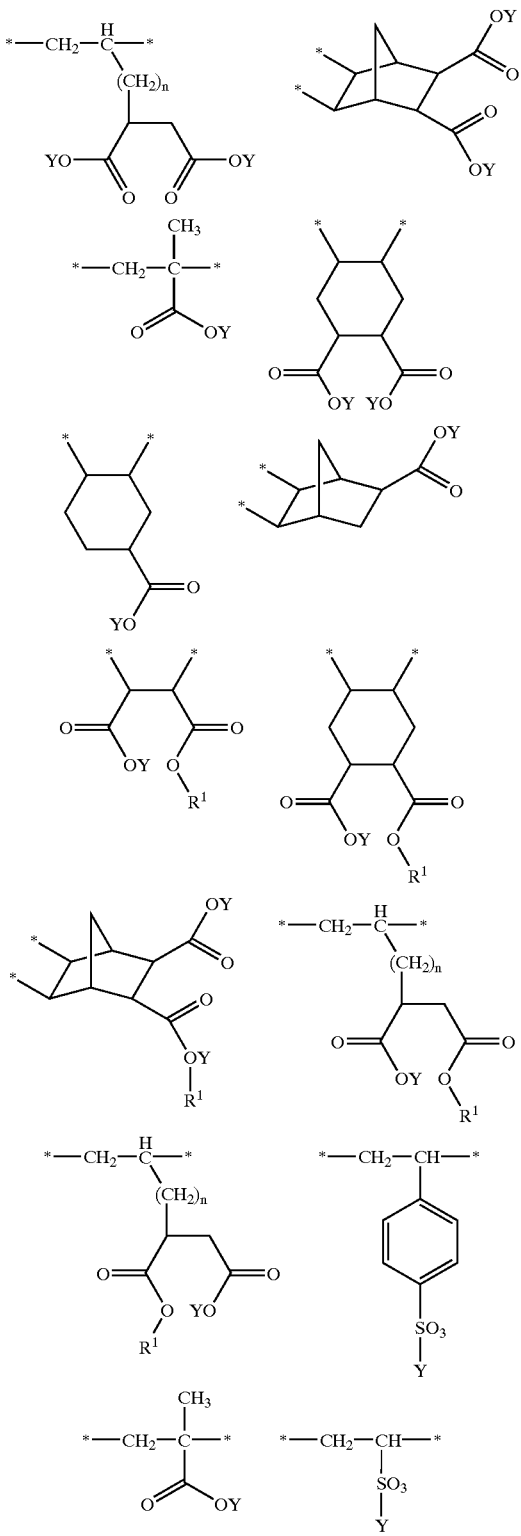

The elimination of the acid-labile radical from the acid-labile group with liberation of the polar group is shown below by way of example for two preferred repeating units. In the first example, the repeating unit comprises a tert-butyl ester group, from which a carboxyl group is liberated under the action of acid.

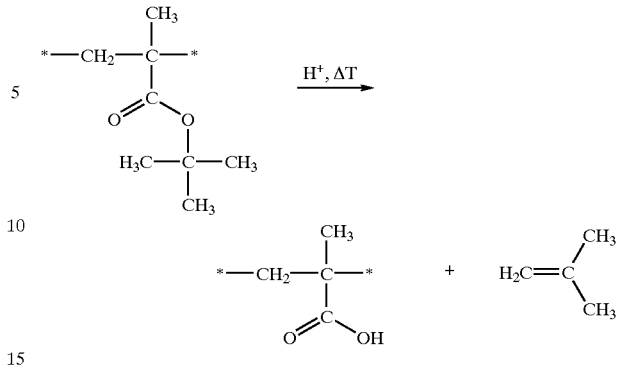

In the second example, the acid-labile group comprises a tert-butoxycarbonyloxy radical. Under the action of acid, an acidic hydroxyl group is therefore liberated as a polar group.

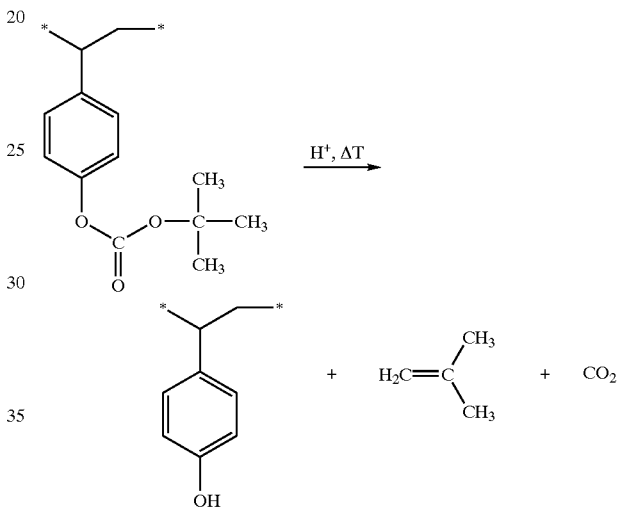

These monomers can be copolymerized with further monomers. A suitable monomer is, for example, styrene. In addition to said monomers, other monomers customary for the preparation of polymers contained in photo-resists can also be used. For example, cycloaliphatic groups can be introduced by copolymerization of norbornene and norbornene derivatives. Silicon-containing groups can be introduced by copolymerization of trialkylallylsilanes. The exact composition of the polymer depends on the properties which are required for the further processing. If the photoresist is used, for example, also for etching the substrate, said photoresist must have sufficient etching resistance. This is achieved by introducing silicon-containing groups, aromatic groups or alicyclic groups into the polymer.

Photo acid generators used may be the photo acid generators customary for photoresists. In a preferred implementation, onium compounds are preferably used as they are described, for example, in the commonly assigned European patent application EP 0 955 562 A1.

For example, methoxypropyl acetate, cyclopentanone, cyclohexanone, γ-butyrolactone, ethyl lactate, diethylene glycol dimethyl ether or a mixture of at least two of these compounds can be used as a solvent of the resist. In general, however, all conventional solvents or mixtures thereof which are capable of taking up the resist components in a clear, homogeneous solution having a long shelf-life and which ensure a good layer quality on coating of the substrate can be used.

The photoresist is applied to the substrate by conventional methods, for example by spin-coating, spraying on or immersion methods. The solvent is then removed by conventional methods. In general, the substrate with the resist film is heated for this purpose.

Exposure of the resist film is then effected, for which purpose the conventional methods may likewise be used. The exposure can be effected, for example, by means of a photo mask or by direct exposure using focused electrons or ions. The exposure radiation preferably has a wavelength in the range from 10 to 400 nm. Since a particularly high resolution is not required for the biocompatible structures, light having a wavelength of 365 nm, 248 nm or 193 nm is usually used, as is also employed in the production of microchips. In the exposed parts, an acid is liberated from the photo acid generator and a latent image of the desired structure forms. The exposure of the resist film is followed by a contrasting step wherein the latent image is amplified and impressed into the polymer of the photoresist so that the photoresist now has a chemical profile. For this purpose, the substrate with the exposed resist film is heated, in general to temperatures of 80 to 200° C. During the heating, the acid-labile groups on the polymer are eliminated under the catalytic influence of the acid and polar groups are liberated. The polymer now has a high polarity and hence solubility in polar solvents. The exposed parts can therefore be removed by means of an aqueous alkaline developer solution. For example, a 2.38% strength solution of tetramethylammonium hydroxide in water can be used as the developer solution. After the development, a structured resist which has structural elements on which the cells are to grow subsequently are obtained. In order to be able to introduce the biocompatible compound into the structured photoresist, the polymer must have corresponding anchor groups for linking a biocompatible compound. For this purpose, it is possible to adopt a procedure wherein the structured photoresist which still comprises acid-labile groups is exposed to a floodlight. An acid is now likewise liberated in the previously unexposed parts. On heating, the acid-labile groups are now likewise eliminated and polar groups, for example carboxyl groups or acidic alcoholic groups, such as, for example, acidic phenolic hydroxyl groups, are liberated. These can then be used as anchor groups for the coordination of the biocompatible compound. It is also possible additionally to provide a thermo acid generator in the photoresist. The structured photo-resist can then be heated, the acid being liberated and the acid-labile groups also being eliminated.

After the liberation of the anchor groups by the elimination of the acid-labile groups, a solution of the biocompatible compound is applied to the structured resist. The solvent is chosen so that the structured resist is not detached from the substrate and at the same time the biocompatible compound is taken up by the solvent in the form of a solution or of an emulsion. For example, buffered aqueous solutions are suitable. The biocompatible compound, which has a suitable coordination group, now coordinates to the anchor groups of the polymer. This need not necessarily take place with the formation of a covalent bond. The coordination of the biocompatible compound to the anchor group of the polymer can also take place with salt formation if, for example, the anchor groups on the polymer are formed by carboxyl groups and the coordinate group on the biocompatible compound is formed by an amino group. Coordination by dipole-dipole interaction is also possible, provided that sufficiently strong immobilization of the biocompatible compound in the photoresist is effected. Such coordination of the biocompatible compound to the anchor group of the polymer by noncovalent bonds has the advantage that the bonding is reversible. If, for example, growth factors are added as the biocompatible compound to the structured resist, they can be taken up by the cells and hence the cell growth can be influenced.

In some cases, it may be preferable if the biocompatible compound is bonded to the polymer of the photoresist by a covalent bond. The formation of a covalent bond can be effected in a downstream step by heating the photoresist and, for example, forming an amide bond from an ammonium carboxylate with elimination of water.

The coordination of the biocompatible compound with formation of a covalent bond can also be effected by a reaction with suitable groups of the polymer. For this purpose, the anchor groups for binding the biocompatible compound in the polymer are formed as reactive anchor groups. A reactive anchor group is understood as meaning an anchor group in the polymer to which the biocompatible compound is coordinated with formation of a covalent bond. The reactive anchor group has sufficient reactivity to permit the formation of a chemical bond to the biocompatible compound within sufficient short reaction times. Suitable groups are, for example, carboxylic anhydrides, epoxides, isocyanates, glycidyl ethers, amines, alkyl halides, thiols and acyl halides.

Particularly preferably, the polymer comprises carboxylic anhydride groups as reactive anchor groups. These can be introduced into the polymer by, for example, copolymerizing maleic anhydride, itaconic anhydride, methacrylic anhydride, cyclohexene-dicarboxylic anhydride or norbornenedicarboxylic anhydride during the preparation of the polymer. Exemplary repeating units of the polymer, which have a dicarboxylic anhydride function, are shown below:

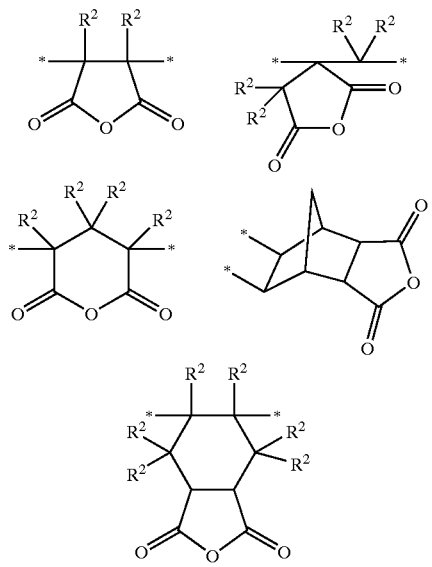

$R^2$ is preferably hydrogen or any other radical, in particular an alkyl radical having 1 to 10 carbon atoms. The radicals $R^2$, independently of one another, may have the same meaning.

As already mentioned, the biocompatible compound must have a suitable coordination group for coordination to an anchor group of the polymer. Particularly preferably, the biocompatible compound comprises an amino group and/or a hydroxyl group, via which the biocompatible compound is coordinated to the anchor group of the polymer. The coordination can be effected via an individual group or via a plurality of groups. The coordination is effected, for example, by the reaction of the amino group with a carboxylic anhydride with formation of an amide bond or of an imido group. If a hydroxyl group of the biocompatible compound is used for the coordination, an ester group is correspondingly formed. Such bonds can be enzymatically cleaved by cells, so that the biocompatible compound can be eliminated again from the resist as a cell during the growth of the cell.

All compounds which facilitate growth of cells on the structures produced from the photoresist can in principle be used as the biocompatible compound. Some of these compounds may be high molecular weight biological compounds. In a preferred embodiment, the biocompatible compound comprises a spacer which carries the amino group or the hydroxyl group for the coordination of the biocompatible compound to the anchor group of the polymer. This facilitates binding of high molecular weight compounds to the polymer, since the steric hindrance is reduced. In addition, the action of the biocompatible compound improves if it is separated from the surface of the structured resist by means of a spacer. Techniques for immobilizing high molecular weight compounds on the surfaces are known, for example, from the immobilization of antigens on high molecular weight proteins. Corresponding techniques can also be used for the coordination of the biocompatible compound to the anchor groups of the polymer.

The biocompatible compound used is preferably an amino acid or a peptide. These compounds already contain groups, for example amino groups, which can be used for the coordination of the biocompatible compound to the polymer of the resist. Peptides used may be, for example, growth factors. The amino acid or the peptide can in turn also be used as a coordination site to which the corresponding growth-promoting factors are reversibly bound. During the growth of the cells, these factors are then removed from the surface of the structured resist and taken up by the cells.

According to a further advantageous embodiment, the biocompatible compound is an oligomeric or polymeric urethane. Urethanes can be enzymatically cleaved by cells. Such compounds therefore promote the growth of cells.

In principle, all materials which are compatible with the growth of cells can be used as the substrate. Thus, for example, polymeric materials or semiconductors, such as, for example, silicon, can be used. Since the structured resist is to be used for information transmission between microelectronics and cells, for example by transmission of electrical signals, the substrate is preferably a microchip. This may comprise corresponding microelectronic circuits.

With the above in view there is also provided, in accordance with the invention, a biocompatible microchip comprising:

a substrate which comprises microelectronic circuits and a structured resist which is arranged on the substrate and contains a polymer which has anchor groups to which a biocompatible compound is coordinated.

The invention provides a process based on lithographic processes which have already long been used industrially for the production of microchips. Considerable know-how has therefore accumulated with regard to carrying out these techniques. Structures with dimensions required for bioelectronic applications can be readily produced by these processes. The structured resist remains on the substrate and, after appropriate conditioning by a biocompatible compound, is covered with cell growth.

Repeated reference is had in the above text to several commonly assigned earlier disclosures, namely, U.S. Pat. No. 5,234,793, European patent EP 0 395 917 B1, International PCT publication WO 01/42860, and European patent application EP 0 955 562 A1. These disclosures, as far as they are pertinent with regard to this text, are herewith incorporated by reference.

I claim:

1. A method of producing biocompatible structures, which comprises:

providing a substrate;

depositing a chemically amplified photoresist containing a polymer with anchor groups for linking a biocompatible compound on the substrate;

structuring the photoresist to form a structured resist; and subsequently treating the structured resist with a biocompatible compound to coordinate the biocompatible compound to the anchor groups of the polymer.

2. The method according to claim 1, wherein:

the chemically amplified photoresist contains the following components:

a polymer comprising acid-labile groups which, after an elimination thereof, liberates a polar group increasing a solubility of the polymer in aqueous alkaline developers, and anchor groups for linking a biocompatible compound;

a photo acid generator; and a solvent;

and the method comprises:

drying the photoresist to form a photoresist film;

exposing the photoresist film by section-by-section exposure to form an exposed photoresist film;

heating the exposed photoresist film and eliminating the acid-labile groups from the polymer in exposed sections;

developing the exposed and heated photoresist film with an aqueous alkaline developer solution, to detach the exposed sections of the photoresist film from the substrate and to form the structured resist;

applying a solution of the biocompatible compound to coordinate the biocompatible compound with the anchor groups of the polymer; and removing excess solution of the biocompatible compound.

3. The method according to claim 2, wherein the anchor groups are present in protected form and the method further comprises liberating the anchor groups prior to applying the solution of the biocompatible compound.

4. The method according to claim 1, wherein the anchor groups for linking the biocompatible compound are a reactive anchor group to which the biocompatible compound is coordinated with formation of a covalent bond.

5. The method according to claim 4, the reactive anchor group is selected from the group consisting of carboxylic anhydride, epoxide, isocyanate, glycidyl ether, amine, alkyl halide, thiol, and acyl halide.

6. The method according to claim 1, wherein the biocompatible compound has at least one substituent selected from the group consisting of an amino group and a hydroxyl group, and the substituent coordinates the biocompatible compound to the anchor group of the polymer.

7. The method according to claim 5, wherein the biocompatible compound includes a spacer carrying the amino group or the hydroxyl group for coordinating the biocompatible compound to the anchor group of the polymer.

8. The method according to claim 1, wherein the biocompatible compound includes a component selected from the group consisting of an amino acid and a peptide.

9. The method according to claim 1, wherein the biocompatible compound is a urethane selected from the group consisting of an oligomeric urethane and a polymeric urethane.

10. The method according to claim 1, wherein the substrate is a microchip.

11. A method of producing biocompatible structures, which comprises:

providing a substrate;

depositing a chemically amplified photoresist on the substrate, the photoresist containing:
 a polymer comprising acid-labile groups which, after an elimination thereof, liberates a polar group increasing a solubility of the polymer in aqueous alkaline developers, and anchor groups;
 a photo acid generator; and
 a solvent;

drying the photoresist to form a photoresist film;

exposing the photoresist film by section-by-section exposure to form an exposed photoresist film with exposed sections;

heating the exposed photoresist film and eliminating the acid-labile groups from the polymer in the exposed sections;

developing the exposed and heated photoresist film with an aqueous alkaline developer solution, to detach the exposed sections of the photoresist film from the substrate and to form a structured resist;

subsequently applying a solution of a biocompatible compound to coordinate the biocompatible compound with the anchor groups of the polymer; and removing excess solution of the biocompatible compound.

12. The method according to claim 11, wherein the anchor groups are present in protected form and the method further comprises liberating the anchor groups prior to applying the solution of the biocompatible compound.

* * * * *